(12) United States Patent
Bradley et al.

(10) Patent No.: US 10,348,421 B1
(45) Date of Patent: Jul. 9, 2019

(54) DEVICE FOR DETECTING AND INDICATING POWER

(71) Applicant: ANRITSU COMPANY, Morgan Hill, CA (US)

(72) Inventors: Donald Anthony Bradley, Morgan Hill, CA (US); Richard Glenn Barber, Morgan Hill, CA (US); Stephen Andrew Robertson, San Jose, CA (US); Russel A. Brown, San Jose, CA (US); Elijah Brandon Jones, San Jose, CA (US); Danny Quintos Barrera, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 630 days.

(21) Appl. No.: 14/929,043

(22) Filed: Oct. 30, 2015

Related U.S. Application Data

(60) Provisional application No. 62/072,856, filed on Oct. 30, 2014.

(51) Int. Cl.
*H04B 17/10* (2015.01)
*H04B 17/23* (2015.01)

(52) U.S. Cl.
CPC ........... *H04B 17/102* (2015.01); *H04B 17/23* (2015.01)

(58) Field of Classification Search
None
See application file for complete search history.

(56) References Cited

U.S. PATENT DOCUMENTS

| | | | |
|---|---|---|---|
| 5,801,525 | A | 9/1998 | Oldfield |
| 5,812,039 | A | 9/1998 | Oldfield |
| 5,909,192 | A | 6/1999 | Finch |
| 5,977,779 | A | 11/1999 | Bradley |
| 6,049,212 | A | 4/2000 | Oldfield |
| 6,291,984 | B1 | 9/2001 | Wong |
| 6,316,945 | B1 | 11/2001 | Kapetanic |
| 6,331,769 | B1 | 12/2001 | Wong |
| 6,496,353 | B1 | 12/2002 | Chio |
| 6,504,449 | B2 | 1/2003 | Constantine |
| 6,509,821 | B2 | 1/2003 | Oldfield |

(Continued)

OTHER PUBLICATIONS

Gijzen, 6 GHz milli-Watt meter with DL5NEG power sensor, Jan. 2009.*

(Continued)

*Primary Examiner* — Mohammed Rachedine
(74) *Attorney, Agent, or Firm* — Tucker Ellis LLP

(57) ABSTRACT

In accordance with an embodiment a device is usable to measure radio frequency (RF) signals including microwave signals to provide an alarm when a power level at its input exceeds predetermined levels. A user can attach the device to a coax cable on a microwave or wireless tower to determine if certain power levels are present and what levels are exceeded. If high power is indicated by the device, the user will then avoid attaching that coax cable to other measurement equipment which would be damaged by excessive RF power. The device is further usable, for example, to apply power to one coax cable in a cable bundle then identify which cable of the bundle is getting the power by connecting the device on the output end of each coax in the bundle, one by one.

20 Claims, 8 Drawing Sheets

(56) References Cited

U.S. PATENT DOCUMENTS

| | | |
|---|---|---|
| 6,525,631 B1 | 2/2003 | Oldfield |
| 6,529,844 B1 | 3/2003 | Kapetanic |
| 6,548,999 B2 | 4/2003 | Wong |
| 6,650,123 B2 | 11/2003 | Martens |
| 6,665,628 B2 | 12/2003 | Martens |
| 6,670,796 B2 | 12/2003 | Mori |
| 6,680,679 B2 | 1/2004 | Stickle |
| 6,700,366 B2 | 3/2004 | Truesdale |
| 6,700,531 B2 | 3/2004 | Abou-Jaoude |
| 6,714,898 B1 | 3/2004 | Kapetanic |
| 6,766,262 B2 | 7/2004 | Martens |
| 6,832,170 B2 | 12/2004 | Martens |
| 6,839,030 B2 | 1/2005 | Noujeim |
| 6,882,160 B2 | 4/2005 | Martens |
| 6,888,342 B2 | 5/2005 | Bradley |
| 6,894,581 B2 | 5/2005 | Noujeim |
| 6,917,892 B2 | 7/2005 | Bradley |
| 6,928,373 B2 | 8/2005 | Martens |
| 6,943,563 B2 | 9/2005 | Martens |
| 7,002,517 B2 | 2/2006 | Noujeim |
| 7,011,529 B2 | 3/2006 | Oldfield |
| 7,016,024 B2 | 3/2006 | Bridge |
| 7,019,510 B1 | 3/2006 | Bradley |
| 7,054,776 B2 | 5/2006 | Bradley |
| 7,068,046 B2 | 6/2006 | Martens |
| 7,088,111 B2 | 8/2006 | Noujeim |
| 7,108,527 B2 | 9/2006 | Oldfield |
| 7,126,347 B1 | 10/2006 | Bradley |
| 7,284,141 B2 | 10/2007 | Stickle |
| 7,304,469 B1 | 12/2007 | Bradley |
| 7,307,493 B2 | 12/2007 | Feldman |
| 7,509,107 B2 | 3/2009 | Bradley |
| 7,511,577 B2 | 3/2009 | Bradley |
| 7,521,939 B2 | 4/2009 | Bradley |
| 7,545,151 B2 | 6/2009 | Martens |
| 7,683,602 B2 | 3/2010 | Bradley |
| 7,683,633 B2 | 3/2010 | Noujeim |
| 7,705,582 B2 | 4/2010 | Noujeim |
| 7,746,052 B2 | 6/2010 | Noujeim |
| 7,764,141 B2 | 7/2010 | Noujeim |
| 7,872,467 B2 | 1/2011 | Bradley |
| 7,924,024 B2 | 4/2011 | Martens |
| 7,957,462 B2 | 6/2011 | Aboujaoude |
| 7,983,668 B2 | 7/2011 | Tiernan |
| 8,027,390 B2 | 9/2011 | Noujeim |
| 8,058,880 B2 | 11/2011 | Bradley |
| 8,145,166 B2 | 3/2012 | Barber |
| 8,156,167 B2 | 4/2012 | Bradley |
| 8,159,208 B2 | 4/2012 | Brown |
| 8,169,993 B2 | 5/2012 | Huang |
| 8,185,078 B2 | 5/2012 | Martens |
| 8,278,944 B1 | 10/2012 | Noujeim |
| 8,294,469 B2 | 10/2012 | Bradley |
| 8,305,115 B2 | 11/2012 | Bradley |
| 8,306,134 B2 | 11/2012 | Martens |
| 8,410,786 B1 | 4/2013 | Bradley |
| 8,417,189 B2 | 4/2013 | Noujeim |
| 8,457,187 B1 | 6/2013 | Aboujaoude |
| 8,493,111 B1 | 7/2013 | Bradley |
| 8,498,582 B1 | 7/2013 | Bradley |
| 8,593,158 B1 | 11/2013 | Bradley |
| 8,629,671 B1 | 1/2014 | Bradley |
| 8,630,591 B1 | 1/2014 | Martens |
| 8,666,322 B1 | 3/2014 | Bradley |
| 8,718,586 B2 | 5/2014 | Martens |
| 8,760,148 B1 | 6/2014 | Bradley |
| 8,816,672 B1 | 8/2014 | Bradley |
| 8,816,673 B1 | 8/2014 | Barber |
| 8,884,664 B1 | 11/2014 | Bradley |
| 8,903,149 B1 | 12/2014 | Noujeim |
| 8,903,324 B1 | 12/2014 | Bradley |
| 8,942,109 B2 | 1/2015 | Dorenbosch |
| 9,103,856 B2 | 8/2015 | Brown |
| 9,103,873 B1 | 8/2015 | Martens |
| 9,176,174 B1 | 11/2015 | Bradley |
| 9,176,180 B1 | 11/2015 | Bradley |
| 9,210,598 B1 | 12/2015 | Bradley |
| 9,239,371 B1 | 1/2016 | Bradley |
| 9,287,604 B1 | 3/2016 | Noujeim |
| 9,331,633 B1 | 5/2016 | Robertson |
| 9,366,707 B1 | 6/2016 | Bradley |
| 9,455,792 B1 | 9/2016 | Truesdale |
| 9,560,537 B1 | 1/2017 | Lundquist |
| 9,571,142 B2 | 2/2017 | Huang |
| 9,588,212 B1 | 3/2017 | Bradley |
| 9,594,370 B1 | 3/2017 | Bradley |
| 9,606,212 B1 | 3/2017 | Martens |
| 9,696,403 B1 | 7/2017 | Elder-Groebe |
| 9,733,289 B1 | 8/2017 | Bradley |
| 9,753,071 B1 | 9/2017 | Martens |
| 9,768,892 B1 | 9/2017 | Bradley |
| 9,860,054 B1 | 1/2018 | Bradley |
| 9,964,585 B1 | 5/2018 | Bradley |
| 9,967,085 B1 | 5/2018 | Bradley |
| 9,977,068 B1 | 5/2018 | Bradley |
| 10,003,453 B1 | 6/2018 | Bradley |
| 10,006,952 B1 | 6/2018 | Bradley |
| 10,064,317 B1 | 8/2018 | Bradley |
| 10,116,432 B1 | 10/2018 | Bradley |
| 2006/0250135 A1* | 11/2006 | Buchwald .......... H04B 10/2575 324/322 |
| 2011/0037667 A1* | 2/2011 | Varjonen .............. G01R 1/0408 343/703 |
| 2016/0050032 A1* | 2/2016 | Emerson .............. H04B 17/102 455/115.2 |

OTHER PUBLICATIONS

Dingfelder, Herbert, "A Low-Cost High-Performance RF Power Sensor", retrieved Jan. 18, 2019 from <http://www.herbert-dingfelder.de/?page_id=68> 3 pages.

* cited by examiner

*RF Sniffer Frequency Compensation*

DEVICE FOR DETECTING AND INDICATING POWER

CLAIM OF PRIORITY

This application claims the benefit of priority to U.S. Provisional Application titled "DEVICE FOR DETECTING AND INDICATING POWER", Application No. 62/072,856, filed Oct. 30, 2014.

TECHNICAL FIELD

The present invention relates generally to devices for detecting and indicating power at a potential signal source.

BACKGROUND

Signal measurement devices, such as vector network analyzers (VNAs) and scalar network analyzers (SNAs), are commonly used for measuring parameters indicative of performance of a device under test (DUT). A technician can measure the performance of an antenna in a cellular network, for example, by disconnecting the antenna from a transmitter associated with the antenna and connecting the antenna to the signal measurement device. The signal measurement device can transmit test signals and receive reflected signals in response. However, signal measurement devices commonly operate at powers below 100 milliwatt (mW) (i.e., below 20 dBm), much lower than typical transmit powers of DUTs.

In a telecommunication network environment, many opportunities present themselves for inadvertently damaging equipment via accidental exposure to a high power signal source. For example, an antenna for a high power transmitter can be remotely connected to the transmitter via multiple cables. For example, a cable leading to an antenna and a cable leading from a high power transmitter may be connected together in a jumper room. A technician testing the antenna will typically do so in the jumper room by disconnecting the appropriate cable and reconnecting the cable to a signal measurement device. This presents an opportunity for a low power signal measurement device to be accidentally connected with a cable leading to a high power transmitter rather than to the antenna. A signal transmitted at the high powers associated with a transmitter for a cellular site can damage the circuitry of a signal measurement device, which is designed to operate at powers many magnitudes lower.

SUMMARY

Embodiments of the present invention include a device usable to measure radio frequency (RF) signals including microwave signals to provide an alarm when a power level at its input exceeds predetermined levels. In an embodiment, a user can attach the device to a coax cable on a microwave or wireless tower to determine if certain power levels are present and what levels are exceeded. If high power is indicated by the device, the user will then avoid attaching that coax cable to other measurement equipment which would be damaged by excessive RF power. The device is further usable, for example, to apply power to one coax cable in a cable bundle then identify which cable of the bundle is getting the power by connecting the device on the output end of each coax in the bundle, one by one.

In an embodiment, an input for a RF measurement device includes a series distributed capacitor adapted to couple an RF signal from a center pin of a coaxial cable, the series distributed capacitor including a capacitor terminal comprising a multilayer metal horseshoe-shaped trace interconnected with a circuit of the RF measurement device, a shunt lumped capacitor to ground, and a metal washer configured to allow fine adjustment to a series capacitor value of the input.

In an additional embodiment, a device usable to measure radio frequency (RF) signals including microwave signals to provide an alarm when a power level at its input exceeds predetermined levels can include a probe that can indicate the presence of an electric field when brought in proximity to a power source.

BRIEF DESCRIPTION OF THE DRAWINGS

Further details of the present invention are explained with the help of the attached drawings in which.

DETAILED DESCRIPTION

Figure 1:
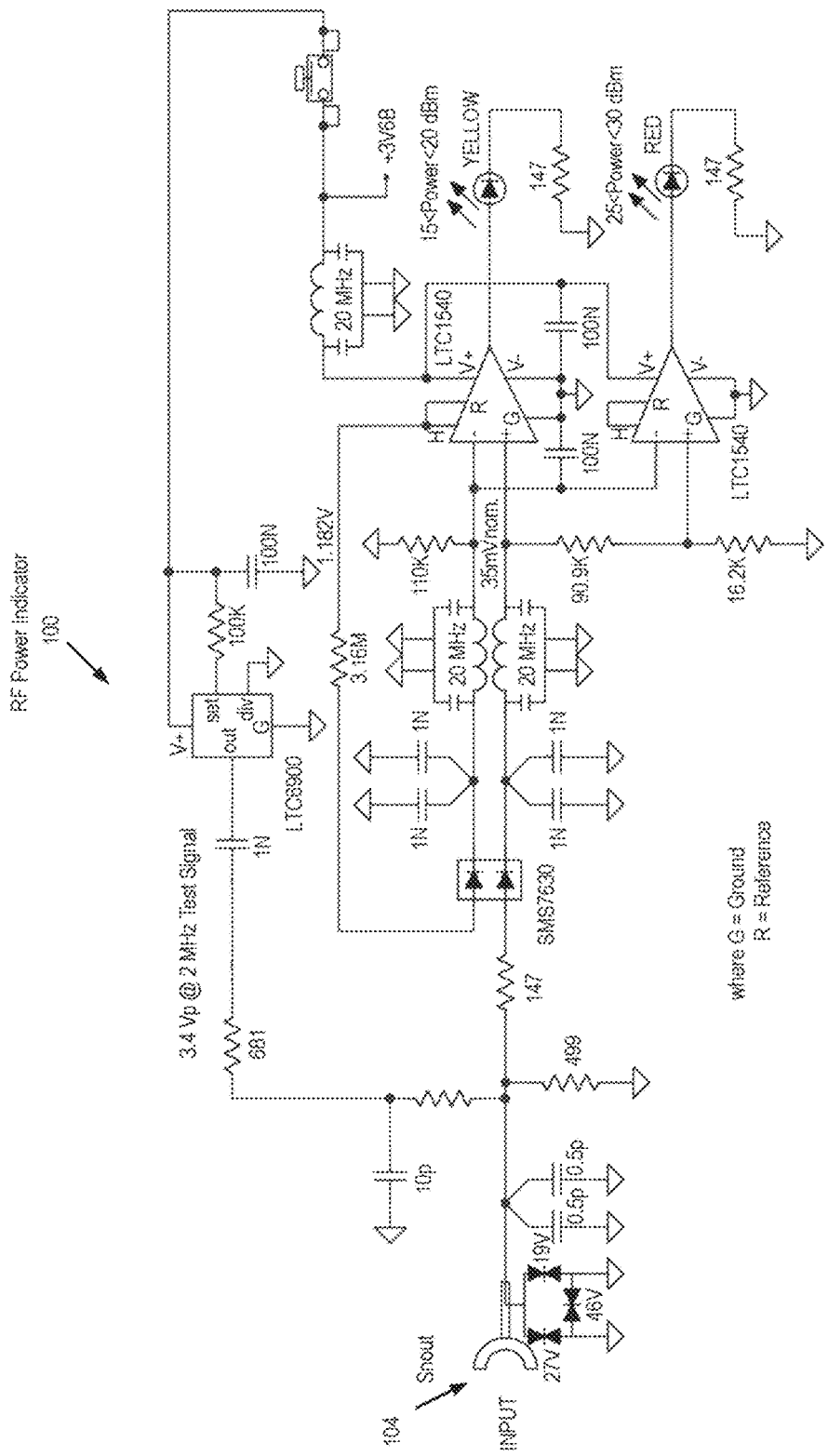
FIG. 1 is a circuit diagram of a device for detecting and indicating RF power in accordance with an embodiment.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number for an embodiment of the invention identifies the sequence in which an individual embodiment is described.

It would be apparent to one of skill in the art that the present invention, as described below, may be implemented in many different embodiments of hardware, software, firmware, and/or the entities illustrated in the figures. Further, the frequencies given for signals generated and/or used, and the values for electronic components (e.g., resistors, capacitors, etc.) in the figures and description are merely exemplary. Any actual software, firmware and/or hardware described herein, as well as any frequencies of signals generated thereby and any values for electronic components, are not limiting of the present invention. Thus, the operation and behavior of the present invention will be described with the understanding that modifications and variations of the embodiments are possible, given the level of detail presented herein.

Devices for detecting and/or measuring signal power have been available in different forms. U.S. Pat. No. 4,032,910 to Hollway, et al. describes a device that senses a radio frequency (RF) field with an antenna. The full strength of the signal is placed on a hot carrier diode, which is connected to an incandescent alarm. However, the device is not capable of interfacing a transmission line. U.S. Pat. Publ. US 2002/0039021 to Wong, et al. describes a root mean square (RMS) power sensor having an 84 dB dynamic range. The device is usable in a power meter application where a 50 ohm load impedance is desired. However, it is not usable when very large powers are present and is therefore not useable as an alarm indicating that preset power levels have been exceeded. Further, the device of Wong is designed for precise power measurement, and as a result the device is costly and not intended for a self-contained and portable, battery operated application.

Devices in accordance with embodiments are usable to determine (and indicate) if a connector is "live" with RF power that could, for example, damage sensitive measuring equipment (i.e., the device is an RF power indicator). In an embodiment, the device is adapted to be mated with a connector to indicate the presence of high-level RF power. In an embodiment, the device is configured to interface a coaxial transmission line (rather than an antenna) and can be temporarily attached to a coax transmission line output to detect RF transmission. For example, a user can attach the device to a coax cable on a microwave or wireless tower to determine if certain power levels are present and what levels are exceeded.

Figure 2:
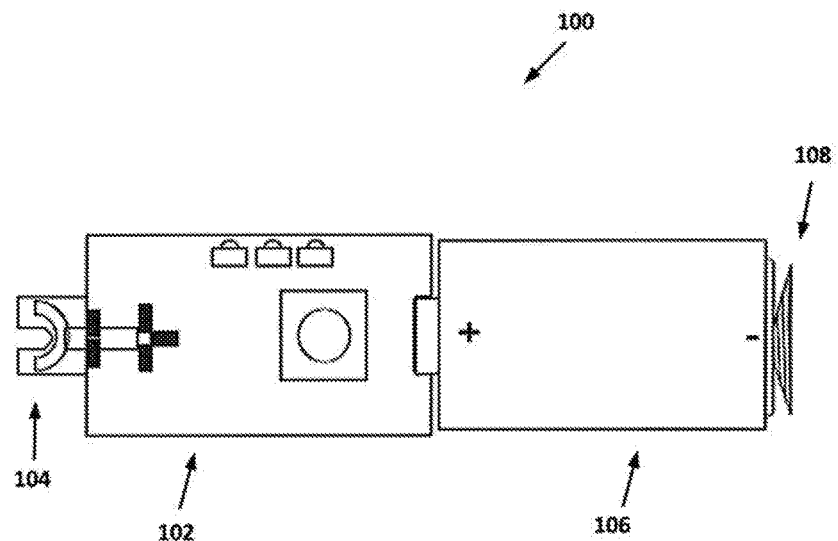
FIG. 2 is a simplified plan view of the device of FIG. 1.
Figure 3:
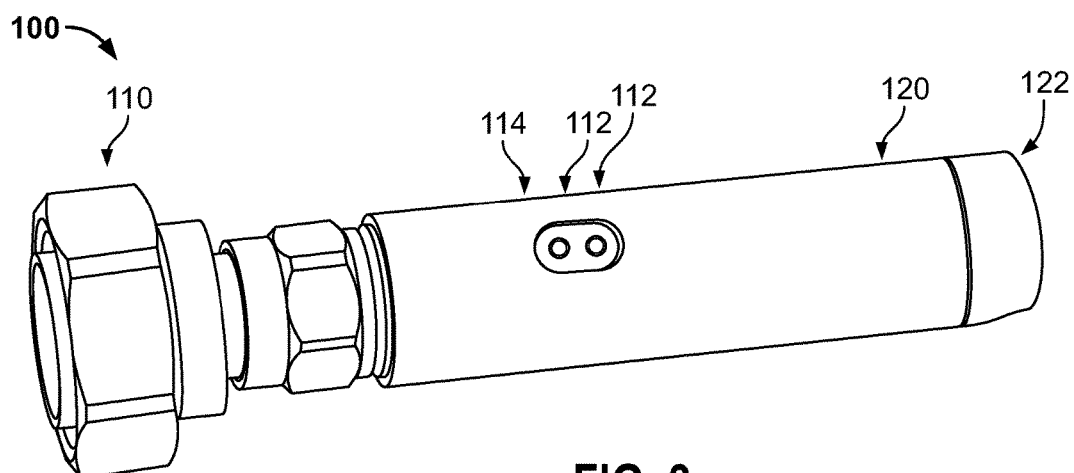
FIG. 3 is a view of the device of FIG. 1 contained in and including a housing in accordance with an embodiment.
Figure 6:
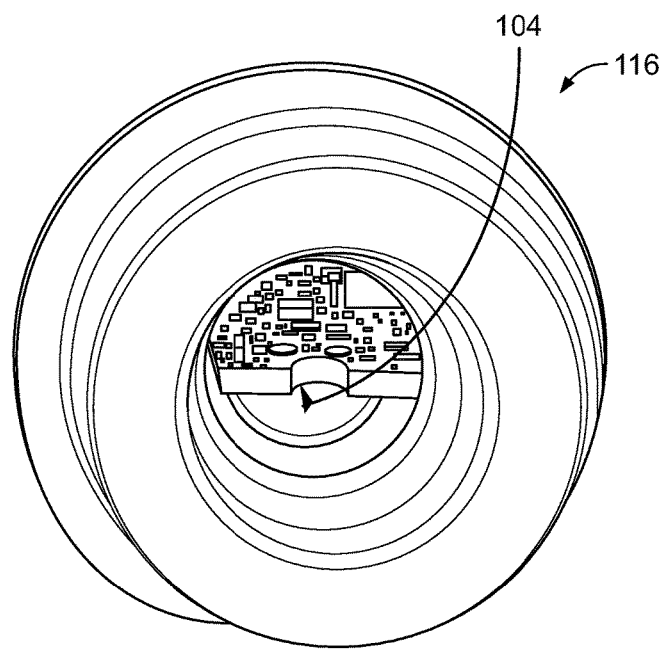
FIG. 6 illustrates a front view looking into an input end of a snout of the device of FIG. 3.
Figure 7:
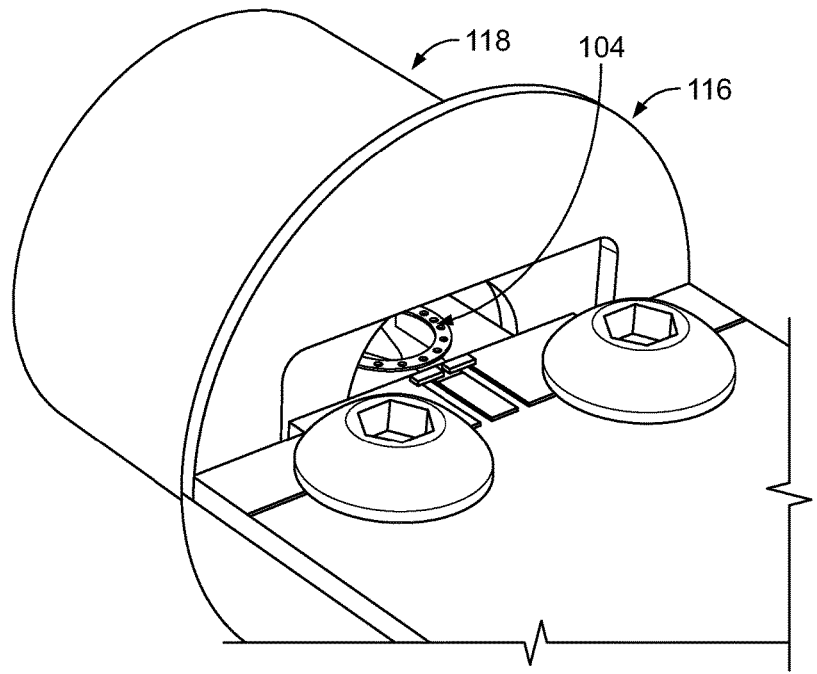
FIG. 7 is a perspective rendering of an interface of the device of FIG. 3.

FIG. 1 is a circuit diagram of a device 100 for detecting and indicating RF power in accordance with an embodiment. In the embodiment, the device can include a horseshoe distributed capacitor 104 as an input device. A test signal with a frequency of 2 MHz is generated at 3.4 V. The horseshoe distributed capacitor can further be seen in FIG. 2 extending from a printed circuit board (PCB) 102 and configured so as to surround the end of a center pin of an RF coaxial adapter 110 (shown in FIGS. 3 and 4 connected with the device 100). The horseshoe distributed capacitor 104 can be further seen in FIG. 6 and FIG. 7.

In an embodiment, the device includes a distributed and lumped capacitive voltage divider which can be used to reduce power entering the device to allow very high power inputs without burnout. In an embodiment, the device further uses digital integrated circuit (IC) comparator circuits and dual zero bias Schottky diodes to allow signal detection and comparator voltage reference within the same package, thereby providing for temperature stability. Trigger points can be provided by digital IC comparators which can run on extremely low current, thereby preserving battery life.

If high-level RF power is detected, the device can provide an alarm in the form of a cue to a user that one or more predetermined power levels is exceeded. Alarm trip points can be determined by the reference voltage. In an embodiment, a visual cue is provided in the form of visual indicators that are activated when predetermined thresholds are exceeded. In other embodiments, the device can further include, or alternatively include, an audial cue such as a pre-recorded message or alarm tone, for example.

Figure 4:
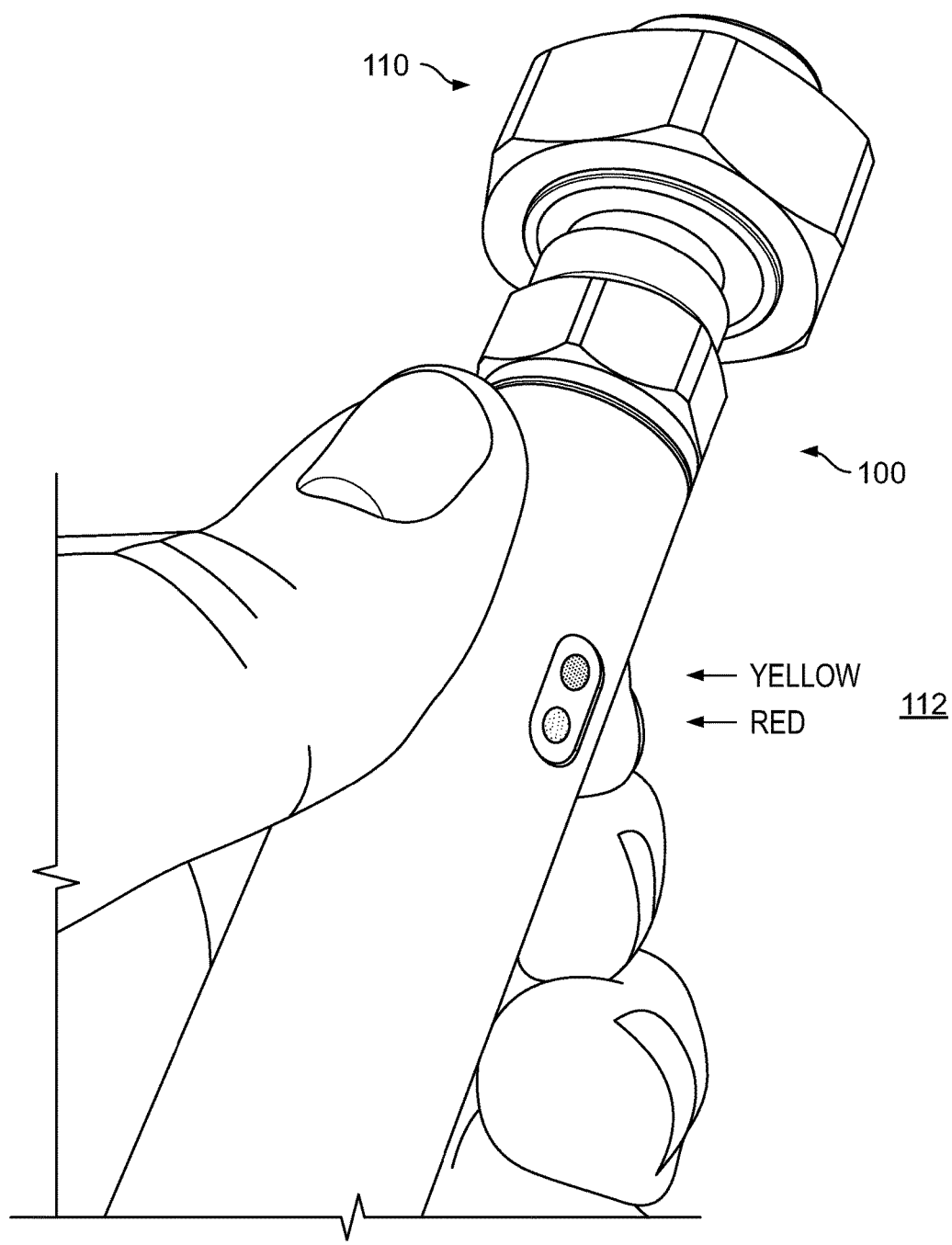
FIG. 4 illustrates the device of FIG. 3 with test button depressed.

As shown in FIG. 4, the device includes a yellow LED that is turned on when RF power exceeds 17 dBm (50 mW) and a red LED that is turned on when RF power exceeds 27 dBm (500 mW), although in other embodiments some other threshold limits can be set along with other colors or forms of cues. In the embodiment shown, the device is usable to detect RF power levels of up to 50 dBm (100 W) from a 50Ω source without being damaged. However, operating at such specification, the device has a very high voltage standing wave ratio (VSWR) and should not be used as a 50Ω termination.

The use of LEDs 112 to provide the alarm can contribute to saving battery life, as LEDs are power efficient. However, in other embodiments other light emitting devices can be used. While the embodiment described above uses a yellow LED and a red LED, any available LED colors can be used. When detected signal exceeds a preset trigger level, the corresponding LEDs will light up. The design is scalable so that in other embodiments more than two trigger circuit comparators/LEDs can be configured.

If high power is indicated by the RF Power Indicator, a notified user can avoid attaching that coax cable to other measurement equipment which would be damaged by excessive RF power. The device is further usable, for example, to apply power to one coax cable in a cable bundle then identify which cable of the bundle is getting the power by connecting the device on the output end of each coax in the bundle, one by one.

In an embodiment, the device is "always on" and ready to be used as needed, having a self-contained battery 106 that can last for years with normal use and is field-replaceable. In an embodiment, the device further includes a "self-test" button 114 that, when pressed, causes both indicators (red and yellow) LEDs to light if internal circuits and battery are functioning.

In an embodiment, the device is a handheld battery operated RF power indicator which is self-contained. The user temporarily connects it to their coax cable output. If certain power levels are exceeded, then one or more alarm LEDs will light depending on how much power is applied. If LEDs light up the user would avoid connecting the same powered cable to a test instrument that could be damaged by excessive input power. As shown, in FIGS. 3-7, the device 100 comprises the RF coax adapter 110, washer 116, snout 118, handle 120, rear cap 122, battery 106, spring, loaded PC board 102, and a lanyard 108, although in other embodiments the device can comprise fewer or additional components. In other embodiments, the device can be housed in some other fashion, such as sealed with an enclosed rechargeable battery that is not accessible to the user.

Devices in accordance with embodiments comprise a capacitive RF voltage divider used at the power indicator front end. RF voltage is reduced to levels that can be tolerated by the detector diode. The capacitive RF voltage divider dissipates very little of the incident power, eliminating the need for a large heat sink such as would be required for a resistive attenuator. The capacitive RF voltage divider further protects detector components from electrostatic discharge (ESD) on the center conductor, and is itself tolerant to high levels of ESD.

In an embodiment, the capacitive RF voltage divider can comprise an arrangement of components including a series distributed capacitor that couples RF signal from a coax center pin, a shunt lumped capacitor to ground completing the capacitive divider, and a metal washer that can provide fine adjustment to series capacitor value. The series distributed capacitor includes a first capacitor terminal comprised of multilayer metal horseshoe-shaped trace that can be interconnected with vias on the end of a PC board and a second capacitor terminal comprised of the center pin of a coax line.

Devices in accordance with some embodiments further comprise a power indicator that includes a set of components to achieve best bandwidth and response flatness, as provided in the circuit in FIG. 1. The power indicator can provide flatter response with power input alarm trigger points that change little versus frequency over the intended bandwidth. Response controls comprise a number of components. A series resonance acts to increase detector sensitivity at the high frequency end of the measurement band. This resonance is provided by transmission line and parasite inductances in series with detector diode capacitance and stray capacitance. A series resistor damps the series resonance described above. Adjustment of the series resistor changes bandwidth of the resonance, thereby facilitating detector "flatness" adjustment at the high frequency end of the measurement band. Shunt resistance to ground controls low frequency cutoff because the source impedance presented by the capacitive divider increases as frequency decreases. It also provides direct current (DC) ground return for a detector. The self-series resonance of shunt divider caps occurs above the band and decreases sensitivity.

Devices in accordance with some embodiments further comprise a self-check oscillator signal injected into a front end. The oscillator signal can provides the ability for checking that the device is fully functional prior to use. The oscillator signal is injected into the RF detector diode through the same circuitry that provides control of the low frequency band edge.

Devices in accordance with some embodiments further comprise a portable coaxial power indicator that provides a high impedance power detector front end for sensing high power and facilitating multiple trip point power level alarms.

Figure 5:
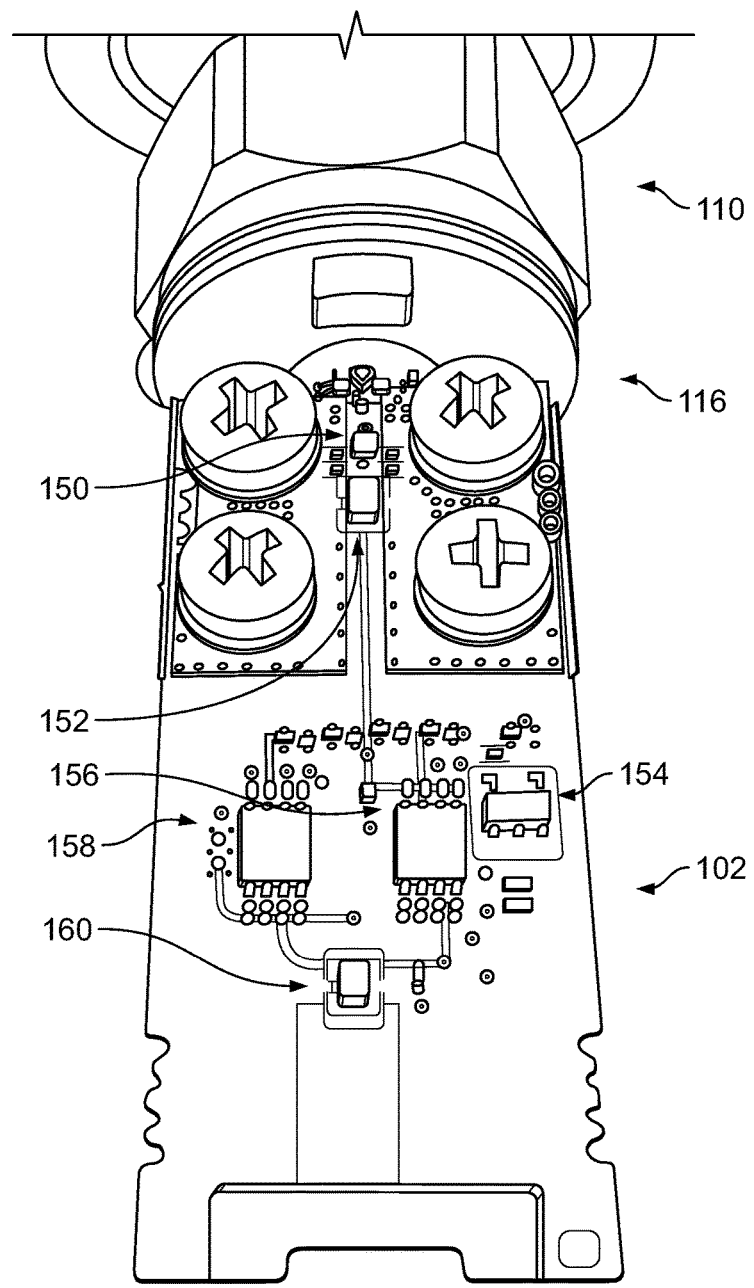
FIG. 5 is a top view of the device of FIG. 3.

As shown in FIG. 5, the circuit of FIG. 1 can be fabricated on a PCB, using commercially available components. For example, the device can use for signal detection an SMS7630 series component including surface mount detector Schottky diodes available from Skyworks Solutions, Inc. The PCB can also include a model LTC6900-low power, 1 kHz to 20 MHz oscillator available from Linear Technology Corp., and pair of low power comparators each comprising a model LTC1540 low power comparator with reference also available from Linear Technology Corp. As indicated in FIG. 5, a pair components 150, 152 to provide series resonance are shown mounted on the PCB, as well as the IC comparator circuit components 156, 158, a low power oscillator 154 and a series resonance component 160 for the test switch. Depressing the test switch allows a user to check that the device is fully functional.

Figure 8:
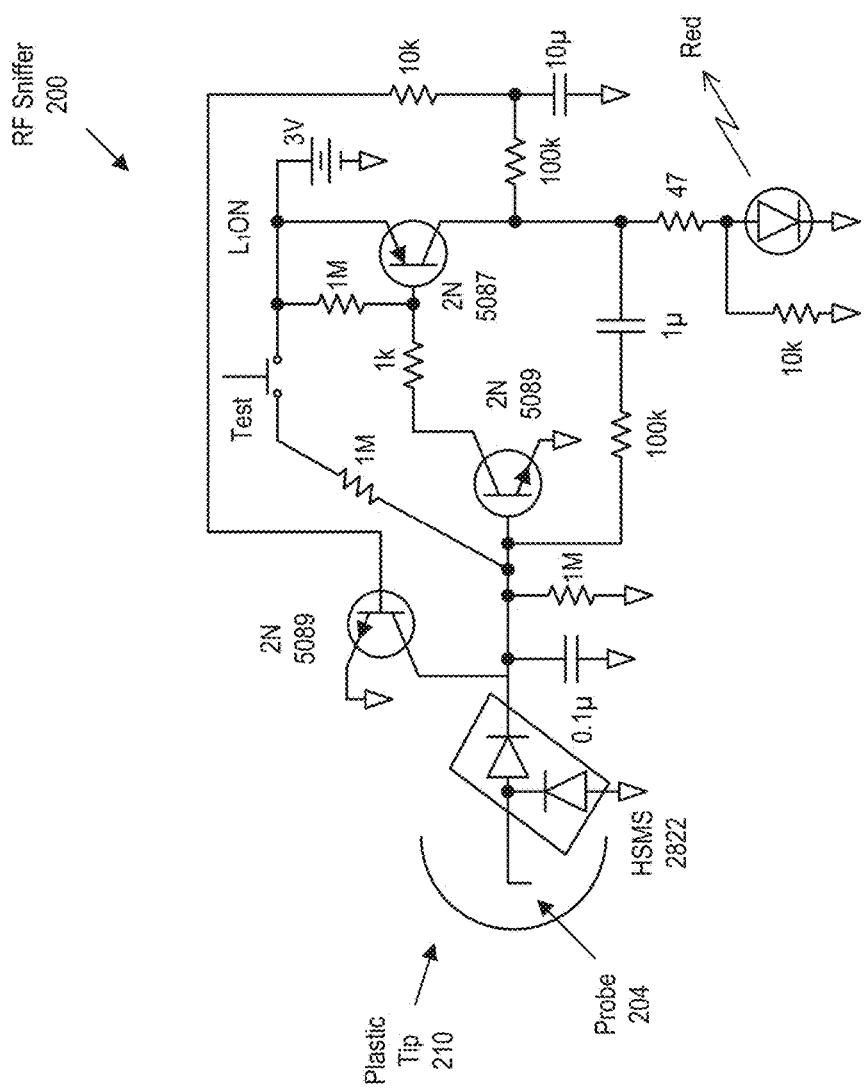
FIG. 8 is a circuit diagram of a device for detecting and indicating RF power in accordance with a further embodiment.
Figure 9:
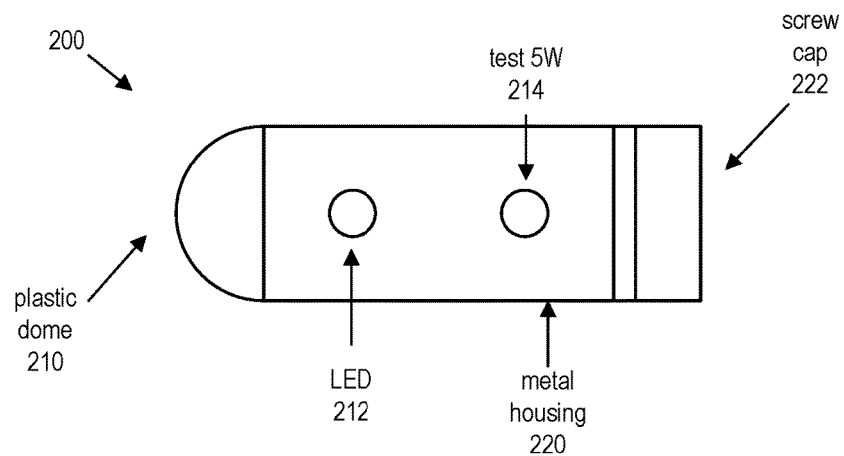
FIG. 9 is a simplified plan view of the device of FIG. 8 contained in and including a housing in accordance with an embodiment.

FIG. 8 is a circuit diagram and FIG. 9 is a simplified plan view of a device 200 for detecting and indicating RF power in accordance with a further embodiment. In the embodiment, the device includes a probe 204 in substitution for the horseshoe distributed capacitor of FIG. 1 as an input device. The device is a relative measuring device, with LEDs that blink faster as the probe gets closer you get to a source of RF. The probe is enclosed, as shown by a plastic tip or dome, and RF is coupled into the circuit as the probe is brought into proximity of an RF source. As such, the probe is not arranged at a consistently fixed distance from the RF source, as is the case with previous embodiments. The fixed distance of the input of the device 100 of FIG. 1 can allow for calibrated measuring. However, the device 200 of FIG. 8 can be used without the use of an RF coax adapter. As can be seen, the device includes a plastic tip enclosing the probe, an LED (or other indicator), a test switch, a housing, and a screw cap. In other embodiments the device can include some other indicator, such as an audial cue, and can be housed in some other fashion, such as sealed with an enclosed rechargeable battery that is not accessible to the user.

Figure 10:
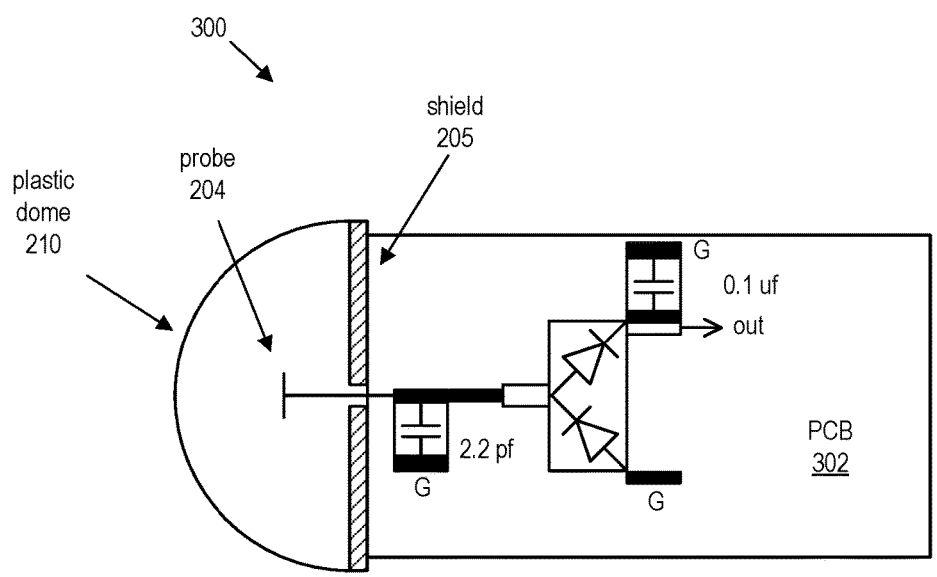
FIG. 10 is a side view and a simplified circuit diagram of an RF detection front end usable with the device of FIG. 8.
Figure 11:
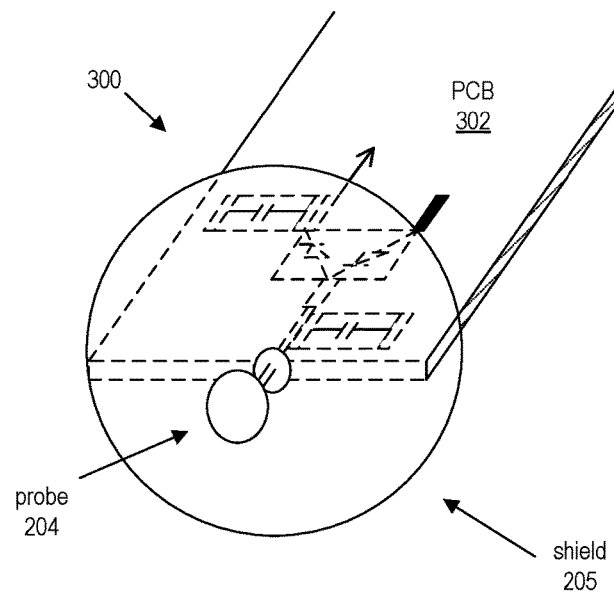
FIG. 11 is a simplified perspective view of an RF detection front end usable with the device of FIG. 8.
Figure 12:
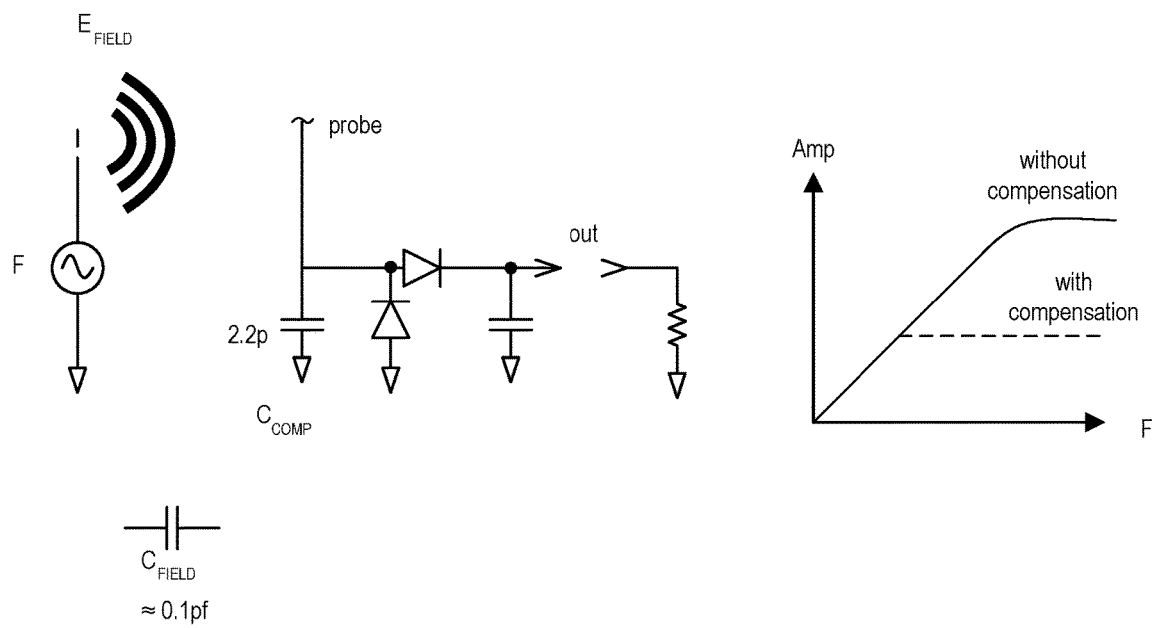
FIG. 12 is a partial circuit diagram illustrating frequency compensation usable with the device of FIG. 8.

FIGS. 10-12 are partial circuit diagrams and schematics of a front end of a device 300 for detecting and indicating RF power in accordance with a further embodiment. In the embodiment, the device includes frequency compensation in the form of additional circuit components of a PCB 302 including a compensation capacitor $C_{comp}$. An example of the difference in amplitude response with change in frequency is shown for the circuit in FIG. 12.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

The invention claimed is:

1. A radio frequency (RF) power indicator comprising:
a housing;
an RF coaxial adapter attached to the housing and configured to connect to a coaxial cable carrying an RF signal;
a circuit board inside the housing, the circuit board having an LED visible from outside the housing;
a series distributed capacitor comprising a center pin of the RF coaxial adapter positioned within a multilayer metal horseshoe-shaped trace connected to the circuit board;
wherein the multilayer metal horseshoe-shaped trace is configured to generate an input signal in the circuit board in response to the RF signal provided to the center pin of the coaxial adapter by the coaxial cable;
a circuit on the circuit board configured to receive the input signal and illuminate the LED if the RF signal has a power which exceeds a predetermined limit;
wherein the circuit includes:
a detector diode,
a transmission line and parasite inductances in series with detector diode capacitance and stray capacitance;
series resistance configured to dampen series resonance;
shunt resistance to ground configured to control low frequency cutoff; and
shunt divider capacitance configured to self series resonance above a bandwidth of the RF power indicator to decrease sensitivity above the bandwidth of the RF power indicator.

2. The RF power indicator of claim 1, further comprising:
an oscillator signal source;
a button on the housing;
wherein the button is configured to trigger the oscillator to provide an RF test signal to the detector diode; and wherein the RF test signal is of sufficient power to cause the circuit to illuminate the LED if the RF power indicator is functioning correctly.

3. The RF power indicator of claim 1, wherein the circuit is configured to illuminate the LED if the RF signal has a power which exceeds a 50 mW.

4. The RF power indicator of claim 1, wherein the circuit is configured to illuminate the LED if the RF signal has a power which exceeds a 500 mW.

5. The RF power indicator of claim 1, further comprising another LED visible from outside the housing;
wherein the circuit is configured to illuminate the LED if the RF signal has a power which exceeds a 50 mW; and
wherein the circuit is configured to illuminate the another LED if the RF signal has a power which exceeds a 500 mW.

6. The RF power indicator of claim 1, further comprising:
a shunt lumped capacitor to ground; and
a metal washer configured to allow fine adjustment to a capacitance of the series capacitor.

7. The RF power indicator of claim 1, further comprising:
a digital integrated circuit comparator circuit configured to determine whether the RF signal has a power which exceeds the predetermined limit.

8. The RF power indicator of claim 1, wherein:
the RF power indicator is self-contained, handheld, and battery operated.

9. The RF power indicator of claim 1, further comprising:
a shunt lumped capacitor to ground coupled to the distributed series capacitor to form a capacitive RF voltage divider which reduces input signal voltage levels applied to the detector diode.

10. A radio frequency (RF) power indicator comprising:
a housing;
an RF coaxial adapter attached to the housing and configured to connect to a coaxial cable carrying an RF signal;
a circuit board inside the housing, the circuit board having two LEDs visible from outside the housing;
a series distributed capacitor comprising a center pin of the RF coaxial adapter positioned within a multilayer metal horseshoe-shaped trace connected to the circuit board;
wherein the multilayer metal horseshoe-shaped trace is configured to generate an input signal in the circuit board in response to the RF signal provided to the center pin of the coaxial adapter by the coaxial cable;
a circuit on the circuit board configured to receive the input signal and illuminate the first LED if the RF signal has a power which exceeds a first predetermined limit and illuminate the second LED if the RF signal has a power which exceeds a second predetermined limit;
wherein the circuit includes:
a detector diode,
a transmission line and parasite inductances in series with detector diode capacitance and stray capacitance;
series resistance configured to dampen series resonance;
shunt resistance to ground configured to control low frequency cutoff; and
shunt divider capacitance configured to self series resonance above a bandwidth of the RF power indicator to decrease sensitivity above the bandwidth of the RF power indicator.

11. The RF power indicator of claim 10, further comprising:
an oscillator signal source a button on the housing, wherein the button is configured to trigger the oscillator to provide an RF test signal to the detector diode;
wherein the RF test signal is of sufficient power to cause the circuit to illuminate the first LED and second LED if the RF power indicator is functioning correctly.

12. The RF power indicator of claim 10, wherein the circuit is configured to illuminate the first LED if the RF signal has a power which exceeds a 50 mW.

13. The RF power indicator of claim 10, wherein the circuit is configured to illuminate the second LED if the RF signal has a power which exceeds a 500 mW.

14. The RF power indicator of claim 10, wherein the circuit is configured to illuminate the first LED if the RF signal has a power which exceeds a 50 mW and illuminate the second LED if the RF signal has a power which exceeds a 500 mW.

15. The RF power indicator of claim 10, further comprising:
a shunt lumped capacitor to ground; and
a metal washer configured to allow fine adjustment to a capacitance of the series capacitor.

16. The RF power indicator of claim 10, further comprising:
a first digital integrated circuit comparator circuit configured to determine whether the RF signal has a power which exceeds the first predetermined limit; and
a second digital integrated circuit comparator circuit configured to determine whether the RF signal has a power which exceeds the second predetermined limit.

17. The RF power indicator of claim 10, wherein:
the RF power indicator is self-contained, handheld, and battery operated.

18. The RF power indicator of claim 10, further comprising:
a shunt lumped capacitor to ground coupled to the distributed series capacitor to form a capacitive RF voltage divider which reduces input signal voltage levels applied to the detector diode.

19. A radio frequency (RF) power indicator comprising:
a housing;
an RF coaxial adapter attached to the housing and configured to connect to a coaxial cable carrying an RF signal;
a circuit board inside the housing, the circuit board having a detector diode and two LEDs visible from outside the housing;
a series distributed capacitor comprising a center pin of the RF coaxial adapter positioned within a multilayer metal horseshoe-shaped trace connected to the circuit board;
wherein the multilayer metal horseshoe-shaped trace is configured to generate an input signal in the circuit board in response to the RF signal provided to the center pin of the coaxial adapter by the coaxial cable;
a shunt lumped capacitor to ground coupled to the distributed series capacitor to form a capacitive RF voltage divider which reduces input signal voltage levels applied to the detector diode;
a circuit on the circuit board configured to receive the input signal wherein the circuit includes:
a first digital integrated circuit comparator circuit configured to determine whether the RF signal has a power which exceeds the first predetermined limit and and illuminate the first LED if the RF signal has a power which exceeds the first predetermined limit;
a second digital integrated circuit comparator circuit configured to determine whether the RF signal has a power which exceeds the second predetermined limit and illuminate the second LED if the RF signal has a power which exceeds a second predetermined limit;

a transmission line and parasite inductances in series with detector diode capacitance and stray capacitance;

series resistance configured to dampen series resonance;

shunt resistance to ground configured to control low frequency cutoff; and shunt divider capacitance configured to self series resonance above a bandwidth of the RF power indicator to decrease sensitivity above the bandwidth of the RF power indicator.

20. The RF power indicator of claim 19, further comprising:

an oscillator signal source a button on the housing, wherein the button is configured to trigger the oscillator to provide an RF test signal to the detector diode;

wherein the RF test signal is of sufficient power to cause the circuit to illuminate the first LED and second LED if the RF power indicator is functioning correctly.

* * * * *